US011239389B2

(12) United States Patent
Shih et al.

(10) Patent No.: US 11,239,389 B2
(45) Date of Patent: Feb. 1, 2022

(54) METHOD FOR MANUFACTURING LIGHT-EMITTING ELEMENT AND ELECTRONIC DEVICE APPLYING LIGHT-EMITTING ELEMENT

(71) Applicant: Innolux Corporation, Miao-Li County (TW)

(72) Inventors: Jian-Jung Shih, Miao-Li County (TW); Tsau-Hua Hsieh, Miao-Li County (TW)

(73) Assignee: Innolux Corporation, Miao-Li County (TW)

( * ) Notice: Subject to any disclaimer, the term of this patent is extended or adjusted under 35 U.S.C. 154(b) by 0 days.

(21) Appl. No.: 16/821,994

(22) Filed: Mar. 17, 2020

(65) Prior Publication Data
US 2020/0335662 A1 Oct. 22, 2020

Related U.S. Application Data

(60) Provisional application No. 62/835,575, filed on Apr. 18, 2019.

(30) Foreign Application Priority Data

Nov. 12, 2019 (CN) .......................... 201911099698.6

(51) Int. Cl.
*H01L 33/22* (2010.01)
*H01L 21/683* (2006.01)
(Continued)

(52) U.S. Cl.
CPC .......... *H01L 33/22* (2013.01); *H01L 21/6835* (2013.01); *H01L 25/0753* (2013.01);
(Continued)

(58) Field of Classification Search
CPC . H01L 33/22; H01L 21/6835; H01L 25/0753; H01L 27/1214; H01L 33/0095
(Continued)

(56) References Cited

U.S. PATENT DOCUMENTS 7,749,782 B1 * 7/2010 Knollenberg ....... H01L 33/0095
438/29
9,236,538 B2 * 1/2016 Zhu .......................... H01L 33/44
(Continued)

FOREIGN PATENT DOCUMENTS

CN 101661984 4/2012
CN 105742417 9/2018

OTHER PUBLICATIONS

"Search Report of Europe Counterpart Application", dated Sep. 16, 2020, p. 1-p. 9.

*Primary Examiner* — Vu A Vu
(74) *Attorney, Agent, or Firm* — JCIPRNET

(57) ABSTRACT

The disclosure provides a method for manufacturing a light-emitting element, including the following steps. A light-emitting diode is provided. An energy beam is applied to process a surface of the light-emitting diode, where a power density of the energy beam is greater than 0 mJ/cm² and less than or equal to 2000 mJ/cm². The light-emitting element manufactured using the method for manufacturing a light-emitting element disclosed in embodiments of the disclosure may improve light extraction efficiency, may have a relatively good light-emitting effect, and may be electrically connected to a drive circuit to constitute an electronic device.

17 Claims, 10 Drawing Sheets

(51) Int. Cl.
*H01L 25/075* (2006.01)
*H01L 27/12* (2006.01)
*H01L 33/00* (2010.01)
*H01L 33/62* (2010.01)

(52) U.S. Cl.
CPC ...... H01L 27/1214 (2013.01); H01L 33/0095 (2013.01); H01L 33/62 (2013.01); *H01L 2221/68354* (2013.01); *H01L 2221/68363* (2013.01)

(58) Field of Classification Search
CPC ........... H01L 33/62; H01L 2221/68354; H01L 2221/68363; H01L 33/005; H01L 2933/0083; H01L 33/24
USPC .......................................................... 257/89
See application file for complete search history.

(56) References Cited

U.S. PATENT DOCUMENTS

| | | |
|---|---|---|
| 2010/0151602 A1 | 6/2010 | Knollenberg et al. |
| 2011/0220933 A1 | 9/2011 | Gotoda et al. |
| 2012/0273827 A1 | 11/2012 | Wei et al. |
| 2012/0276670 A1 | 11/2012 | Wei et al. |
| 2020/0194616 A1* | 6/2020 | Henley .................. H01L 22/14 |

* cited by examiner

METHOD FOR MANUFACTURING LIGHT-EMITTING ELEMENT AND ELECTRONIC DEVICE APPLYING LIGHT-EMITTING ELEMENT

CROSS REFERENCE TO RELATED APPLICATION

This application claims the priority benefits of U.S. provisional application Ser. No. 62/835,575, filed on Apr. 18, 2019, and China application serial no. 201911099698.6, filed on Nov. 12, 2019. The entirety of each of the above-mentioned patent applications is hereby incorporated by reference herein and made a part of specification.

BACKGROUND

Field of the Invention

The disclosure relates to a method for manufacturing a semiconductor element, and in particular, to a method for manufacturing a light-emitting element and an electronic device applying a light-emitting element.

Description of Related Art

In recent years, light-emitting elements having light-emitting diodes and electronic devices applying light-emitting elements have gradually become a trend in the display field and the illumination field. For a light-emitting diode, an undoped gallium nitride layer is usually decomposed into a gallium layer and a nitrogen layer by using laser, to separate the light-emitting diode from a sapphire substrate. Since the gallium layer is likely to remain on a surface of the light-emitting diode, the light-emitting efficiency and the light pattern of the light-emitting diode are affected. Currently, the gallium layer on the surface of the light-emitting diode is removed through pickling using hydrogen chloride. However, pickling not only damages the substrate or a solder/bump material of the light-emitting diode, leading to a decrease in a yield or limitation on use of the material, but also causes environmental pollution that goes against the trend of green production. Therefore, one of the urgent issues at present is to effectively remove a gallium layer on a surface of a light-emitting diode to improve the light extraction efficiency of the light-emitting diode.

SUMMARY

The disclosure provides a method for manufacturing a light-emitting element and an electronic device applying a light-emitting element.

According to an embodiment of the disclosure, a method for manufacturing a light-emitting element includes the following steps. A light-emitting diode is provided. An energy beam is applied to process a surface of the light-emitting diode, where a power density of the energy beam is greater than 0 mJ/cm$^2$ and less than or equal to 2000 mJ/cm$^2$.

According to another embodiment of the disclosure, a method for manufacturing a light-emitting element includes the following steps. A first substrate on which a light-emitting diode is formed is provided. A first energy beam is applied to the first substrate to separate the light-emitting diode from the first substrate and expose a buffer layer of the light-emitting diode. A second energy beam is applied to the buffer layer to form a surface-roughened layer on the light-emitting diode, where a power density of the second energy beam is greater than 0 mJ/cm$^2$ and less than or equal to 2000 mJ/cm$^2$.

According to another embodiment of the disclosure, an electronic device includes a light-emitting element and a drive circuit that is electrically connected to the light-emitting element. A method for manufacturing the light-emitting element includes the following steps. A light-emitting diode is provided. An energy beam is applied to process a surface of the light-emitting diode, where a power density of the energy beam is greater than 0 mJ/cm$^2$ and less than or equal to 2000 mJ/cm$^2$.

According to another embodiment of the disclosure, an electronic device includes a light-emitting element and a drive circuit that is electrically connected to the light-emitting element. A method for manufacturing the light-emitting element includes the following steps. A first substrate on which a light-emitting diode is formed is provided. A first energy beam is applied to the first substrate to separate the light-emitting diode from the first substrate and expose a buffer layer of the light-emitting diode. A second energy beam is applied to the buffer layer to form a surface-roughened layer on the light-emitting diode, where a power density of the second energy beam is greater than 0 mJ/cm$^2$ and less than or equal to 2000 mJ/cm$^2$.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1A:
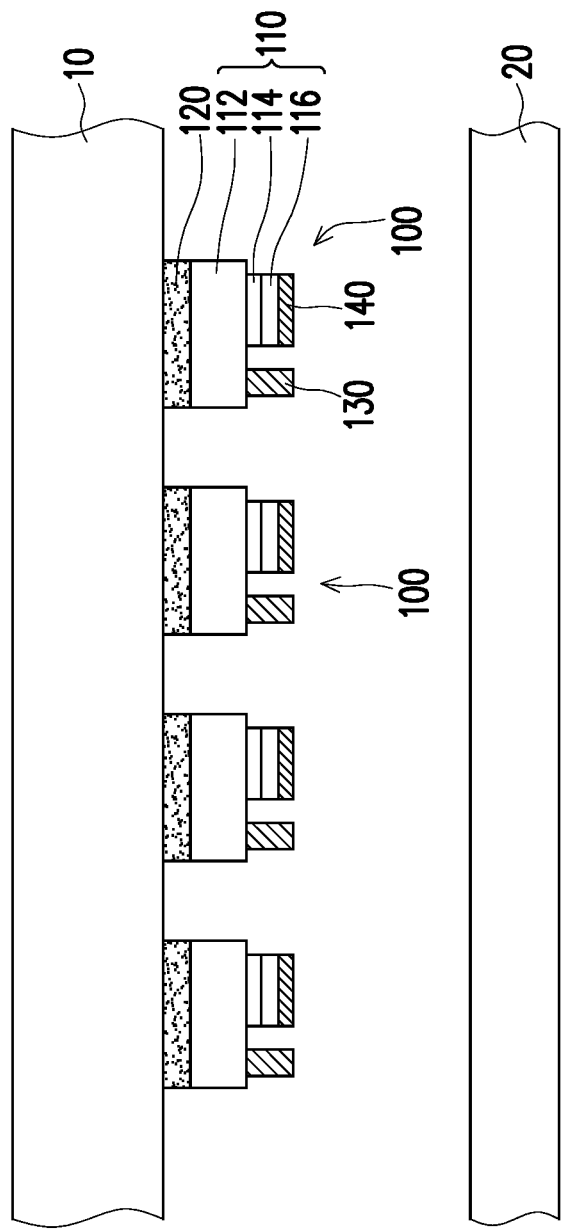
FIG. 1A to FIG. 1E are schematic cross-sectional views of a method for manufacturing a light-emitting element according to an embodiment of the disclosure.

A structure (or layer, component, substrate) being located on another structure (or layer, component, substrate) described in the disclosure may mean that two structures are adjacent and directly connected, or may mean that two structures are adjacent and indirectly connected. Indirect connection means that there is at least one intermediate structure (or intermediate layer, intermediate component, intermediate substrate, intermediate spacing) between two structures, the lower surface of a structure is adjacent or directly connected to the upper surface of the intermediate structure, and the upper surface of the other structure is adjacent or directly connected to the lower surface of the intermediate structure. The intermediate structure may be a single-layer or multi-layer physical structure or non-physical structure, which is not limited. In the disclosure, when a structure is disposed "on" another structure, it may mean that a structure is "directly" disposed on another structure, or a structure is "indirectly" disposed on another structure, that is, at least one structure is sandwiched between a structure and another structure.

The electrical connection or coupling described in the disclosure may refer to a direct connection or an indirect connection. In the case of a direct connection, terminals of two components on a circuit are directly connected or interconnected by a conductor segment. In the case of an indirect connection, there is a combination of one of elements of non-conductor segments such as switches, diodes, capacitors, and inductors and at least one conductive segment or resistor, or a combination of at least two of the elements of non-conductor segments above and at least one conductive segment or resistor between terminals of two components on a circuit.

In the disclosure, the thickness, length and width may be measured by an optical microscope, and the thickness may be measured by a cross-sectional image in an electron microscope, but is not limited thereto. In addition, there may be some error between any two values or directions used for comparison. If a first value is equal to a second value, it implies that there may be an error of approximately 10% between the first value and the second value; if a first direction is perpendicular to a second direction, it implies that an angle between the first direction and the second direction may range from 80 to 100 degrees (80°≤angle≤100°); and if a first direction is parallel to a second direction, it implies that an angle between the first direction and the second direction may range from 0 to 10 degrees (0°≤angle≤10°).

In the following embodiments, same or similar reference numerals are used to indicate same or similar elements, and details may be omitted in the description. In addition, the features in the embodiments may be used in any combination without departing from the spirit of the invention or conflicting with each other, and simple equivalent changes and modifications made to the specification or the claims shall still fall within the scope of the disclosure. In addition, the terms "first", "second", and the like mentioned in the specification or the claims are used only to name discrete elements or to distinguish between different embodiments or ranges, but are not intended to define the upper or lower limit of the number of elements or the manufacturing or arrangement order of the elements.

In the disclosure, the light-emitting element may be a light-emitting diode package unit, an array substrate having at least one light-emitting diode, or a display panel having at least one light-emitting diode. The size of the light-emitting diode is not limited, and the light-emitting diode may include a spectral conversion material such as a fluorescent material, a phosphor, a pigment, or a quantum dot, but is not limited thereto. In the disclosure, the electronic device may be a display device including a light-emitting element, a light source device, a backlight device, a sensing device, an antenna device, or a tiling device, but is not limited thereto. The electronic device may be a bendable or flexible electronic device. It should be noted that the electronic device may be any combination of the foregoing, but is not limited thereto. Furthermore, the electronic device may be applied to any electronic product or electronic equipment, for example, but not limited to, a television, a tablet computer, a notebook computer, a mobile phone, a camera, a wearable device, an electronic entertainment device, a communication antenna, but is not limited thereto.

Exemplary embodiments of the disclosure are described in detail, and examples of the exemplary embodiments are shown in the accompanying drawings. Whenever possible, the same component symbols are used in the drawings and descriptions to indicate the same or similar parts.

FIG. 1A to FIG. 1E are schematic cross-sectional views of a method for manufacturing a light-emitting element according to an embodiment of the disclosure. In the method for manufacturing a light-emitting element in the present embodiment, referring to FIG. 1A first, a light-emitting diode 100 is provided. The step of providing the light-emitting diode 100 includes providing a first substrate 10 on which the light-emitting diode 100 is formed. The light-emitting diode 100 herein is formed on the first substrate 10. The first substrate 10 is, for example, a sapphire substrate, but the disclosure is not limited thereto. In other embodiments, depending on a growth temperature of the light-emitting diode or the temperature resistance of the substrate, the material of the first substrate 10 may include, for example but not limited to, quartz, silicon, glass, plastic, resin, or other material suitable to be used as a substrate. In particular, the light-emitting diode 100 may include an epitaxial structure layer 110, a buffer layer 120, a first-type electrode 130, and a second-type electrode 140. The epitaxial structure layer 110 may include a first-type semiconductor layer 112, a light-emitting layer 114, and a second-type semiconductor layer 116. The light-emitting layer 114 may be located between the first-type semiconductor layer 112 and the second-type semiconductor layer 116, and the buffer layer 120 may be located between the first substrate 10 and the first-type semiconductor layer 112. That is, the light-emitting diode 100 may be in direct contact with the first substrate 10 at the buffer layer 120. The first-type electrode 130 and the second-type electrode 140 may be located on the same side of the light-emitting diode 100. The first-type electrode 130 may be electrically connected to the first-type semiconductor layer 112, and the second-type electrode 140 may be electrically connected to the second-type semiconductor layer 116. That is, the light-emitting diode 100 in the present embodiment may be embodied by a flip chip light-emitting diode, and may be a small-sized micro light-emitting diode (micro LED) or a mini light-emitting diode (mini LED).

Further, the first-type semiconductor layer 112 in the present embodiment may be, for example, an N-type semiconductor layer, the second-type semiconductor layer 116 may be, for example, a P-type semiconductor layer, and the light-emitting layer 114 may be, for example, a multi-quantum well (MQW) layer, but the disclosure is not limited thereto. The buffer layer 120 may include an undoped gallium nitride (GaN) layer for stress compensation with respect to the first substrate 10 in an epitaxial process, and the undoped gallium nitride layer may reduce misfit dislocation density of the overall epitaxial structure 110, thereby improving epitaxy quality. In another embodiment, the material of the buffer layer 120 may include aluminum (Al). The first-type electrode 130 may be, for example, an N-type electrode, and the second-type electrode 140 may be, for example, a P-type electrode, but the disclosure is not limited thereto. In another embodiment, the first-type electrode 130 may be, for example, a P-type electrode, and the second-type electrode 140 may be, for example, an N-type electrode.

It should be noted that, in the present embodiment, at least one of the light-emitting diodes 100 has a buffer layer 120. However, in other embodiments that are not shown, one buffer layer 120 may correspond to a plurality of light-emitting diodes 100. That is, the buffer layer 120 may be, but not limited to, a patterned structure or a wholly unpatterned structure. In other embodiments, a multiplayer buffer layer structure may be located between the light-emitting diode 100 and the first substrate 10, and the buffer layers thereof may respectively include the same material or different materials from the others.

Next, still referring to FIG. 1A, a second substrate 20 is provided opposite the first substrate 10, so that the light-emitting diode 100 is located between the first substrate 10 and the second substrate 20. In this case, the second substrate 20 may function as, for example, a temporary substrate, a shifting substrate, or a final substrate. The material of the second substrate 20 may include glass, silicon, plastic, or resin, and the second substrate 20 as the final substrate may include a thin film transistor (TFT) or other drive elements. The disclosure is not limited thereto.

Figure 1B:
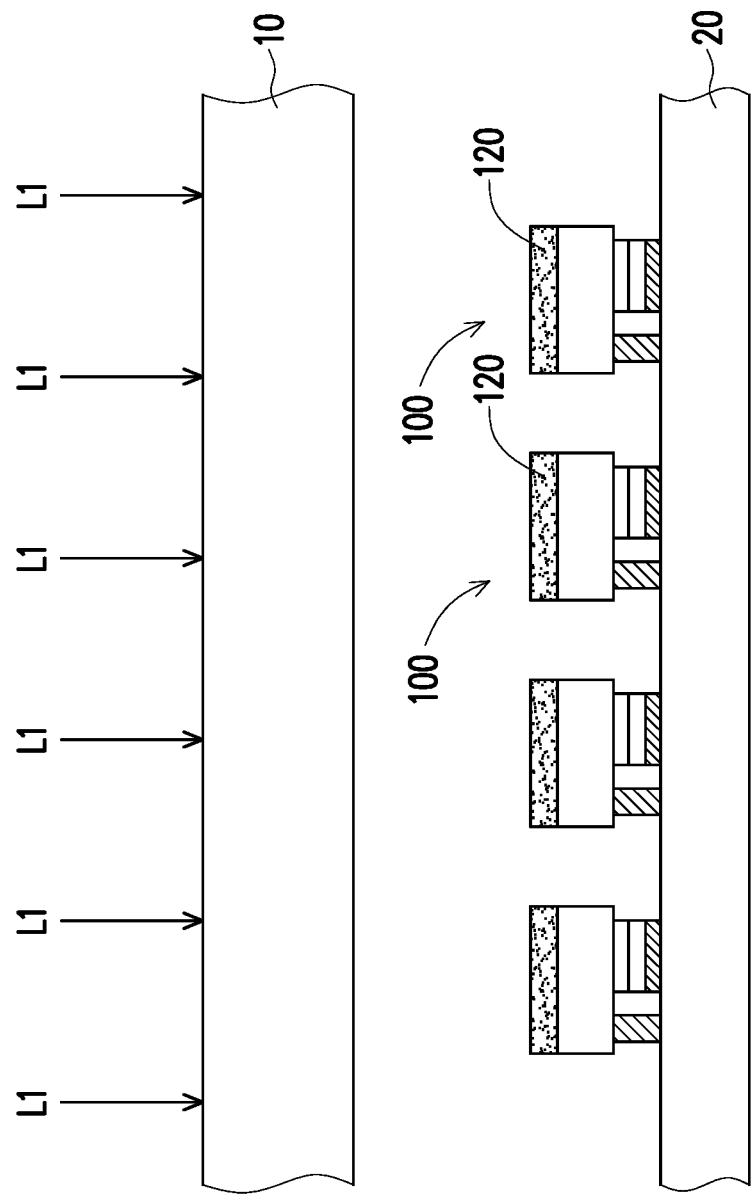
Figure 1C:
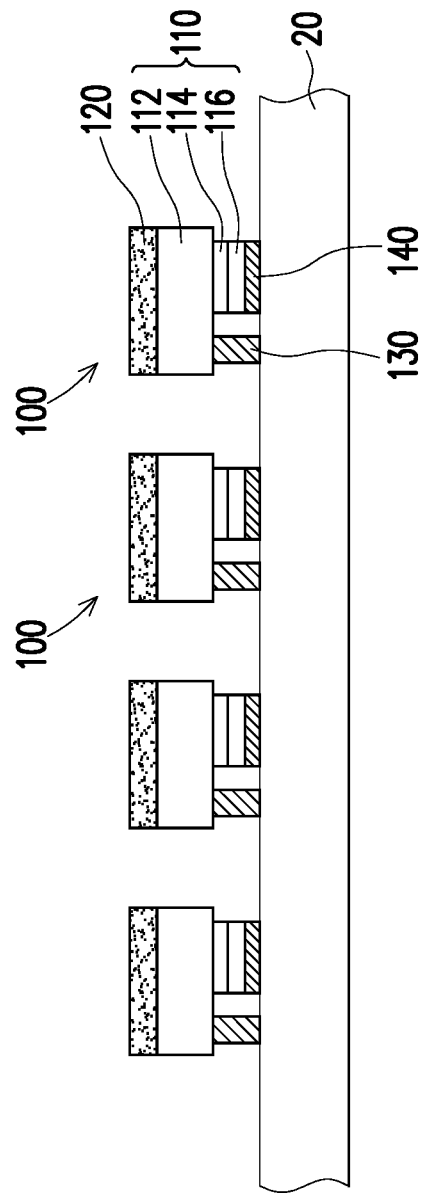

Next, referring to FIG. 1B and FIG. 1C together, an energy beam L1 (which may be deemed as a first energy beam) may be applied to separate the light-emitting diode 100 from the first substrate 10. When the energy beam L1 is applied to the first substrate 10 or an interface between the first substrate 10 and the light-emitting diode 100, the energy beam L1 destroys a bonding force between the light-emitting diode 100 and the first substrate 10 to separate the light-emitting diode 100 from the first substrate 10, and expose the buffer layer 120 of the light-emitting diode 100. In addition, the separated light-emitting diode 100 may be transferred to the second substrate 20, and is in contact with the second substrate 20 at the first-type electrode 130 and the second-type electrode 140. A plurality of electrode pads may be disposed on the second substrate 20 and be electrically connected to the first-type electrode 130 and the second-type electrode 140 respectively. An electrical connection medium or a medium that assists in strengthening an electrical connection, such as an anisotropic conductive adhesive (ACF), a conductive paste, a conductive metal layer, or a resin, may be provided between the electrode pads and the first-type electrode 130 or the second-type electrode 140. Alternatively, no electrical connection medium may be provided between the electrode pads and the first-type electrode 130 or the second-type electrode 140. The electrode pads are electrically connected to the first-type electrode 130 or the second-type electrode 140 in a eutectic manner. In this case, an outermost surface of the light-emitting diode 100 is the buffer layer 120. After the energy beam L1 is applied, a residue (including gallium) of the buffer layer 120 is formed on an upper surface of the buffer layer 120. That is, the material of the buffer layer 120 may include gallium. In this case, the energy beam L1 may be, for example, a laser beam, but the disclosure is not limited thereto. A wavelength and intensity of the laser beam may be adjusted as needed and are not limited.

Figure 1D:
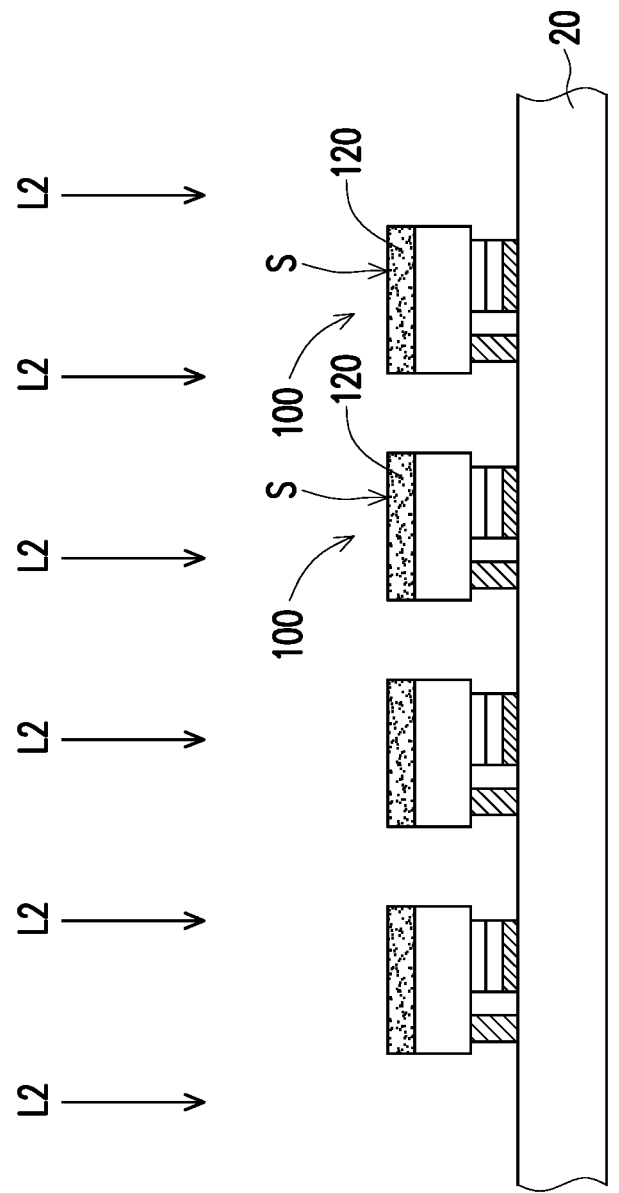

Afterwards, referring to FIG. 1D, an energy beam L2 (which may be deemed as a second energy beam) may be applied to process a surface S of the light-emitting diode 100. A power density of the energy beam L2 is, for example, greater than 0 mJ/cm$^2$ and less than or equal to 2000 mJ/cm$^2$ (0 mJ/cm$^2$<L2≤2000 mJ/cm$^2$). In the present embodiment, the energy beam L2 has a power density greater than 20 mJ/cm$^2$ and less than or equal to 2000 mJ/cm$^2$ (20 mJ/cm$^2$<L2≤2000 mJ/cm$^2$). In an embodiment, a source of the energy beam L2 is the same as a source of the energy beam L1, and the energy beam L2 and the energy beam L1 are respectively laser beams. In another embodiment, the source of the energy beam L2 may be different from the source of the energy beam L1.

In this case, a lower limit of the power density depends on a material and a thickness of the light-emitting diode 100. Generally, a laser power meter may be used to measure a continuous wave (CW) or a repetitive pulse light source, and a sensor used for the laser power meter is generally a thermopile or a photodiode. An optical resonator is a main factor affecting a laser output mode. A longitudinal mode directly affects monochromaticity (a full width at half maximum of a spectral line characteristic peak) of the laser, a coherence length of the laser, and a relationship between an output power and a time. A transverse mode affects a diverge angle, a spot size, and a maximum value of the output power (that is, the energy distribution). A power density may be converted using a spot size, a frequency/wavelength, and an energy magnitude.

Figure 1E:
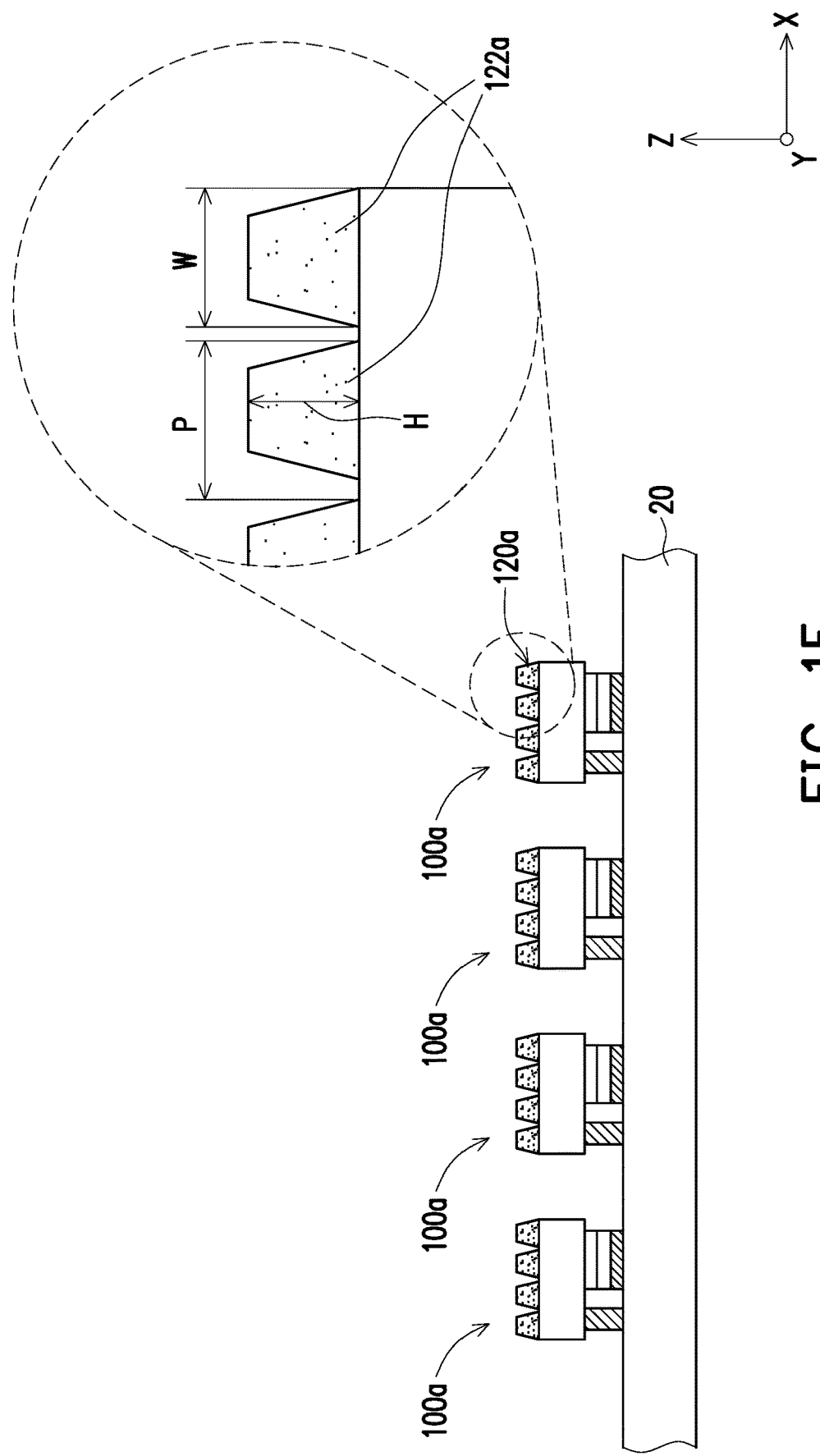

Finally, referring to FIG. 1D and FIG. 1E together, the energy beam L2 may be applied to process the surface S of the light-emitting diode 100. Not only the residue (including gallium) on the buffer layer 120 can be removed, but also a plurality of microstructures 122 can be formed. In particular, the energy beam L2 is applied to the buffer layer 120 to form a surface-roughened layer 120a on the light-emitting diode 100. The surface-roughened layer 120a herein includes a plurality of protruding microstructures (that is, microstructures 122) that may be separated from each other or partially connected to each other and partially separated from each other. That is, the microstructures 122 are bumps. From a cross-sectional view, a shape of the protruding microstructures may include, for example, a trapezoid, a triangle, a semicircle, a semi-ellipse, or an irregular shape, but the disclosure is not limited thereto. Further, a height H of the microstructures 122 is, for example, in a range from 10 nm to 100 nm (10 nm≤H≤100 nm) in a Z-axis direction, but the disclosure is not limited thereto. A width W of the microstructures 122 is, for example, in a range from 10 nm to 1000 nm (10 nm≤W≤1000 nm) in an X-axis direction or a Y-axis direction, but the disclosure is not limited thereto. In an embodiment, the height H is, for example, a maximum height in the Z-axis direction, and the width W is, for example, a maximum width in the X-axis or the Y-axis direction. In another embodiment, the width W may be, for example, a width of a bottom of a microstructure or a width of a bottom connected between two microstructures. A pitch P between two adjacent and separated microstructures 122 is, for example, in a range from 10 nm to 1000 nm (10 nm≤P≤1000 nm) in the X-axis direction or the Y-axis direction, but the disclosure is not limited thereto.

In the present embodiment, a surface roughness of the surface-roughened layer 120a is observed and measured through a focus ion beam (FIB) microscope with a magnification from 5000 to 50000. An observation result under the above conditions is that the roughness of the surface-roughened layer 120a is from 10 nm to 100 nm. The roughness is a height difference (along the Z-axis direction) between a highest point and a lowest point within a unit length that are respectively cut from the surface of the surface-roughened layer 120a. In addition to the focus ion beam microscope, in other embodiments, a scanning electron microscope (SEM) with a magnification from 5000 to 50000, a transmission electron microscope (TEM) with a magnification from 5000 to 50000, or an atomic force microscope (AFM) with a measurement scale from 10 micrometers to 100 micrometers may also be used to measure the roughness of the surface-roughened layer 120a.

In short, the energy beam L2 is applied to remove a residue (including gallium) on the buffer layer 120, and form a microstructure 122 on the surface S of the light-emitting diode 100. That is, in the present embodiment, a derivative or a residue (including gallium) on the buffer layer 120 is removed through the laser processing, and a nanometer scale microstructure 122 is also formed on the surface of the buffer layer 120, so that the light extraction efficiency of the light-emitting diode 100 can be improved. In other words, in the present embodiment, the derivative or the residue (including gallium) on the surface of the light-emitting diode 100 is removed by laser in a physical way which is relatively environmentally friendly compared to a conventional chemical pickling method and conforms to the trend of green production. Up to this point, the manufacture of a light-emitting element 100a is completed. The light-emitting element 100a is disposed on the second substrate 20 on a two-dimensional plane (an X-Y plane) and is electrically connected to a drive element or a drive circuit on the second substrate 20, and a light-emitting diode array substrate or a light-emitting diode light-emitting panel is formed. The light-emitting diode array substrate or the light-emitting diode light-emitting panel may be electrically connected to a drive circuit board or a drive circuit such as an IC of a system, and may be combined with other functional elements and a carrying mechanism to constitute an electronic device.

Since a refractive index (which is for example, approximately 2.4) of the material (including gallium nitride) of the buffer layer 120 is greatly different from the refractive index of other dielectric materials (for example, a refractive index of air is approximately 1), the light extraction efficiency of the light-emitting diode 100 is poor. Generally, in order to improve the light extraction efficiency, a micron-sized structure may be generated on a surface of gallium nitride through a patterned sapphire substrate. However, compared to a micro light-emitting diode in size, the micron-sized structure is still relatively large and unsuitable. In the present embodiment, while the derivative or the residue (including gallium) on the buffer layer 120 is removed in a physical manner, the nanometer scale microstructure 122 is formed on the surface of the buffer layer 120 to be suitable for the micro-sized light-emitting element 100a, thereby improving the light extraction efficiency of the light-emitting element 100a.

In another embodiment, providing the light-emitting diode 100 may be providing the light-emitting diode 100 which has been formed on the second substrate 20 as shown in FIG. 1C. Therefore, in the light-emitting diode 100 here, the residue (including gallium) on the buffer layer 120 may be removed simply by processing the surface S of the light-emitting diode 100 using the energy beam L2 with a power density greater than 20 mJ/cm$^2$ and less than or equal to 2000 mJ/cm$^2$ (20 mJ/cm$^2$<L2≤2000 mJ/cm$^2$), and the microstructure 122 is formed on the surface S of the light-emitting diode 100, which still falls within the scope of protection of the disclosure.

Figure 2A:
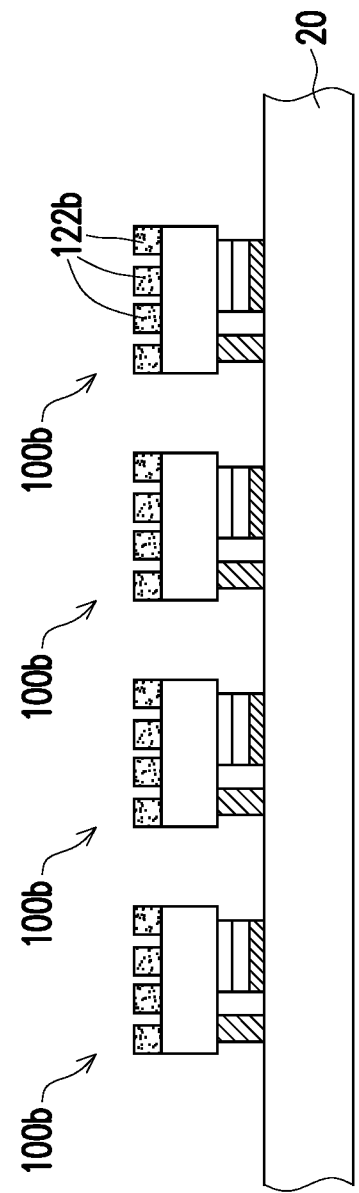
FIG. 2A to FIG. 2C are schematic cross-sectional views of a plurality of types of light-emitting elements according to a plurality of embodiments of the disclosure.
Figure 2B:
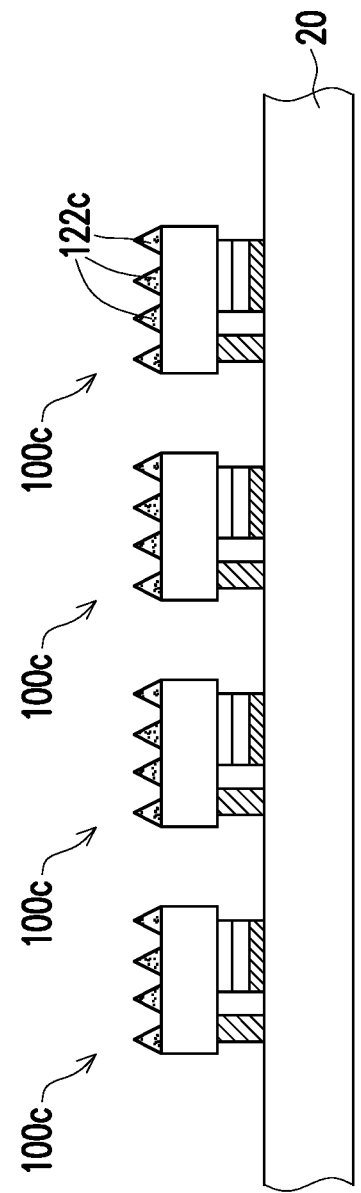
Figure 2C:
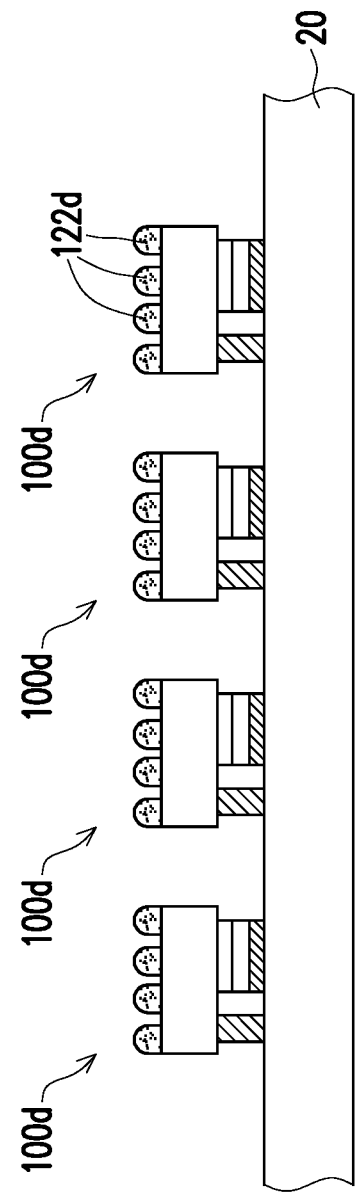

In addition, it should be noted that, in the foregoing embodiment, from a cross-sectional view, a microstructure 122a of a light-emitting element 100a is specifically a trapezoid, but the disclosure is not limited thereto. From a cross-sectional view, in FIG. 2A, a microstructure 122b of a light-emitting element 100b may be a rectangle. Alternatively, from a cross-sectional view, in FIG. 2B, a microstructure 122c of a light-emitting element 100c may be a triangle. Alternatively, from a cross-sectional view, in FIG. 2C, a microstructure 122d of a light-emitting element 100d may be a semi-ellipse. Definitely, in other embodiments that are not shown, the microstructure of the light-emitting element may be a recess. Alternatively, from a cross-sectional view, the microstructure may have other suitable shape or irregular shape, as long as the light extraction efficiency of the light-emitting element can be improved, all of which fall within the scope of protection of the disclosure.

Figure 3A:
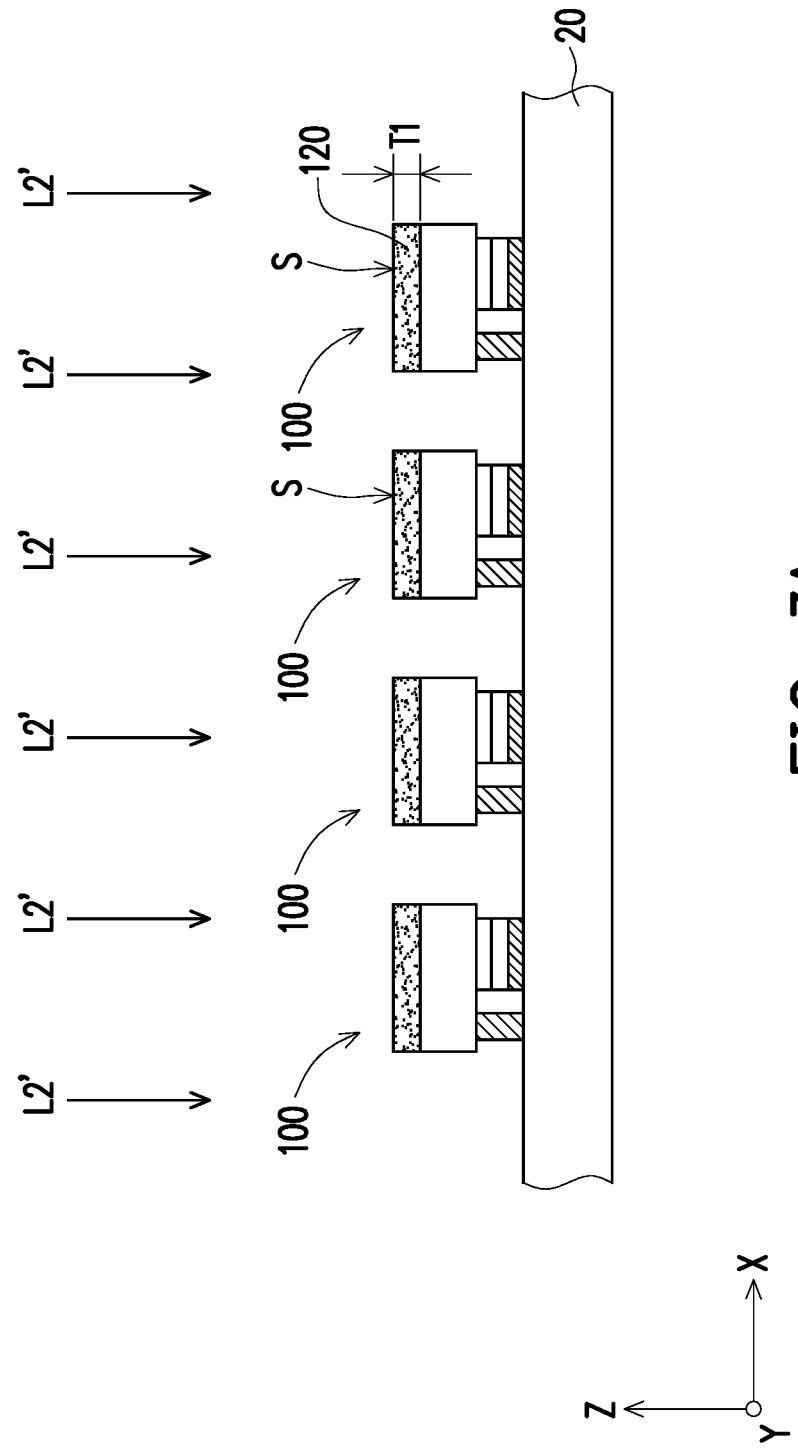
FIG. 3A to FIG. 3B are schematic cross-sectional views of some steps of a method for manufacturing a light-emitting element according to another embodiment of the disclosure.
Figure 3B:
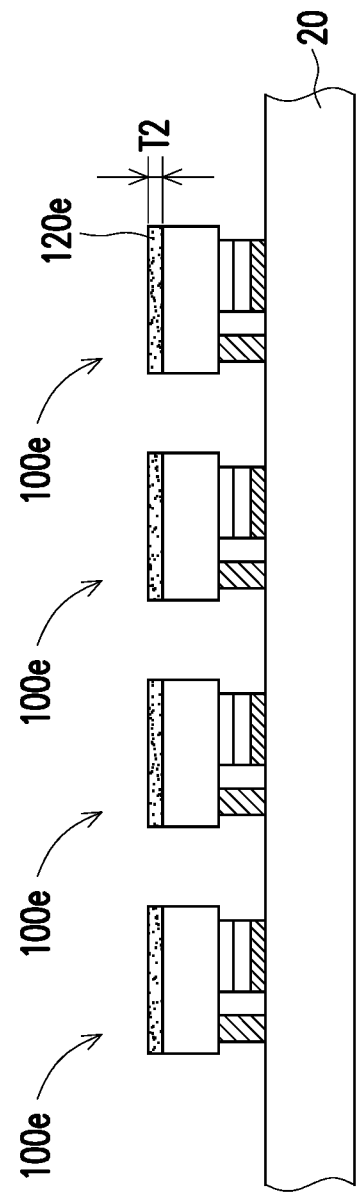

FIG. 3A to FIG. 3B are schematic cross-sectional views of some steps of a method for manufacturing a light-emitting element according to another embodiment of the disclosure. After the steps in FIG. 1C, that is, after the energy beam L1 is applied to separate the light-emitting diode 100 from the first substrate 10, referring to FIG. 3A and FIG. 3B together, an energy beam L2' is applied to process the surface S of the light-emitting diode 100 to remove at least one part of the surface S. A power density of the energy beam L2' herein is greater than 0 mJ/cm$^2$ and less than or equal to 20 mJ/cm$^2$ (0 mJ/cm$^2$<L2'≤20 mJ/cm$^2$).

In particular, the buffer layer 120 in the present embodiment has an area greater than or equal to that of a surface-roughened layer 120e. In addition, the buffer layer 120 in the present embodiment has a first thickness T1, and the surface-roughened layer 120e has a second thickness T2, where the second thickness T2 is less than the first thickness T1. That is, in the present embodiment, the energy beam L2' is applied to thin a residue (including gallium) on the buffer layer 120 to form the surface-roughened layer 120e, a ratio of the residue depending on the power density. In short, in the present embodiment, different residual ratios are achieved by low power densities and a required light-emitting ratio is thereby achieved.

In the present embodiment, a surface roughness of the surface-roughened layer 120e is observed and measured by using a focus ion beam (FIB) microscope with a magnification from 5000 to 50000. An observation result under the above conditions is that the roughness of the surface-roughened layer 120e is from 1 nm to 50 nm. In addition to the focus ion beam microscope, in other embodiments, a scanning electron microscope (SEM) with a magnification from 5000 to 50000, a transmission electron microscope (TEM) with a magnification from 5000 to 50000, or an atomic force microscope (AFM) with a measurement scale from 10 micrometers to 100 micrometers may be used to measure the roughness of the surface-roughened layer 120e. Up to this point, the manufacture of a light-emitting element 100e is completed. The light-emitting element 100e is disposed on the second substrate 20 on a two-dimensional plane (an X-Y plane) and is electrically connected to a drive element or a drive circuit on the second substrate 20, and a light-emitting diode array substrate or a light-emitting diode light-emitting panel is formed. The light-emitting diode array substrate or the light-emitting diode light-emitting panel may be electrically connected to a drive circuit board or a drive circuit such as an IC of a system, and is combined with other functional elements and a carrying mechanism to constitute an electronic device.

It should be noted that, in another embodiment, providing the light-emitting diode 100 may be providing the light-emitting diode 100 which has been formed on the second substrate 20 as shown in FIG. 1C. Therefore, in the light-emitting diode 100 here, the residue (including gallium) on the buffer layer 120 may be thinned simply by processing the surface S of the light-emitting diode 100 using the energy beam L2' with a power density greater than 0 mJ/cm$^2$ and less than or equal to 20 mJ/cm$^2$ (0 mJ/cm$^2$<L2'≤20 mJ/cm$^2$), and the surface-roughened layer 120e is formed.

In summary, in the embodiments of the disclosure, the energy beam is applied to process the surface of the light-emitting diode, where the power density of the energy beam is greater than 0 mJ/cm$^2$ and less than or equal to 2000 mJ/cm$^2$, and therefore the light extraction efficiency of the light-emitting element can be improved, and a relatively good light-emitting effect can be achieved. In an embodiment, the power density of the energy beam is greater than 20 mJ/cm² and less than or equal to 2000 mJ/cm², by which the residue (including gallium) on the buffer layer is removed, and a microstructure is formed on the surface of the light-emitting diode, thereby improving the light extraction efficiency of the light-emitting element. In another embodiment, the power density of the energy beam is greater than 0 mJ/cm² and less than or equal to 20 mJ/cm², by which the residue (including gallium) on the buffer layer is thinned, and the required light-emitting ratio of the light-emitting element is achieved.

It should be noted that the above embodiments are merely intended for describing the technical solutions of the disclosure rather than limiting the disclosure. Although the disclosure is described in detail with reference to the foregoing embodiments, those of ordinary skill in the art should understand that they can still make modifications to the technical solutions described in the foregoing embodiments or make equivalent substitutions to some technical features thereof, without departing from scope of the technical solutions of the embodiments of the disclosure.

What is claimed is:

1. A method for manufacturing a light-emitting element, comprising:
   providing a substrate on which a light-emitting diode is formed; and
   applying an energy beam to process a surface of the light-emitting diode which is the surface away from the substrate to form a plurality of microstructures, wherein a power density of the energy beam is greater than 0 mJ/cm² and less than or equal to 2000 mJ/cm², and from a cross-sectional view, a shape of one of the plurality of microstructures comprises a trapezoid, a rectangle, a triangle, a semi-circle, a semi-ellipse or an irregular shape.

2. The method for manufacturing the light-emitting element according to claim 1, wherein the power density of the energy beam is greater than 20 mJ/cm² and less than or equal to 2000 mJ/cm².

3. The method for manufacturing the light-emitting element according to claim 1, wherein a height of one of the plurality of microstructures is in a range from 10 nm to 100 nm.

4. The method for manufacturing the light-emitting element according to claim 1, wherein a width of one of the plurality of microstructures is in a range from 10 nm to 1000 nm.

5. The method for manufacturing the light-emitting element according to claim 1, wherein a pitch between two adjacent ones of the plurality of microstructures is in a range from 10 nm to 1000 nm.

6. The method for manufacturing the light-emitting element according to claim 1, wherein the power density of the energy beam is greater than 0 mJ/cm² and less than or equal to 20 mJ/cm².

7. The method for manufacturing the light-emitting element according to claim 6, wherein the energy beam is applied to process the surface to remove at least one part of the surface.

8. The method for manufacturing the light-emitting element according to claim 1, wherein providing the light-emitting diode comprises:
   providing a first substrate on which the light-emitting diode is formed; and
   applying another energy beam to separate the light-emitting diode from the first substrate.

9. The method for manufacturing the light-emitting element according to claim 8, wherein a source of the energy beam is different from a source of the another energy beam.

10. The method for manufacturing the light-emitting element according to claim 8, wherein a source of the energy beam is the same as a source of the another energy beam.

11. The method for manufacturing the light-emitting element according to claim 8, wherein the energy beam and the another energy beam are respectively laser beams.

12. A method for manufacturing a light-emitting element, comprising:
   providing a first substrate on which a light-emitting diode is formed;
   applying a first energy beam to the first substrate to separate the light-emitting diode from the first substrate and expose a buffer layer of the light-emitting diode; and
   applying a second energy beam to the buffer layer to form a surface-roughened layer on the light-emitting diode, wherein a power density of the second energy beam is greater than 0 mJ/cm² and less than or equal to 2000 mJ/cm², the surface-roughened layer comprises a plurality of microstructures that are separated from each other, from a cross-sectional view, a shape of one of the plurality of microstructures comprises a trapezoid, a rectangle, a triangle, a semi-circle, a semi-ellipse or an irregular shape.

13. The method for manufacturing the light-emitting element according to claim 12, wherein a source of the second energy beam is different from a source of the first energy beam.

14. The method for manufacturing the light-emitting element according to claim 12, wherein a source of the second energy beam is the same as a source of the first energy beam.

15. The method for manufacturing the light-emitting element according to claim 12, wherein a material of the buffer layer comprises gallium.

16. An electronic device, comprising:
   a light-emitting element, wherein a method for manufacturing the light-emitting element comprises:
      providing a first substrate on which a light-emitting diode is formed;
      applying a first energy beam to the first substrate to separate the light-emitting diode from the first substrate and expose a buffer layer of the light-emitting diode; and
      applying a second energy beam to the buffer layer to form a surface-roughened layer on the light-emitting diode, wherein a power density of the second energy beam is greater than 0 mJ/cm² and less than or equal to 2000 mJ/cm², the surface-roughened layer comprises a plurality of microstructures that are separated from each other, from a cross-sectional view, a shape of one of the plurality of microstructures comprises a trapezoid, a rectangle, a triangle, a semi-circle, a semi-ellipse or an irregular shape; and
   a drive circuit electrically connected to the light-emitting element.

17. The electronic device according to claim 16, wherein the power density of the second energy beam is greater than 20 mJ/cm² and less than or equal to 2000 mJ/cm².

* * * * *